United States Patent
Yu

(10) Patent No.: US 6,326,273 B1
(45) Date of Patent: Dec. 4, 2001

(54) METHOD OF FABRICATING A FIELD EFFECT TRANSISTOR WITH TRAPEZOIDAL SHAPED GATE DIELECTRIC AND/OR GATE ELECTRODE

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/603,017

(22) Filed: Jun. 26, 2000

(51) Int. Cl.$^7$ .................................................. H01L 21/336
(52) U.S. Cl. ........................ 438/301; 438/302; 438/303; 438/305
(58) Field of Search .................................. 438/300–305, 438/291, 287, 288

(56) References Cited

U.S. PATENT DOCUMENTS

| | | | |
|---|---|---|---|
| 5,434,093 | * 7/1995 | Chau et al. | 438/300 |
| 5,856,226 | * 1/1999 | Wu | 438/219 |
| 6,207,485 | * 3/2001 | Gardner et al. | 438/216 |

* cited by examiner

*Primary Examiner*—David Nelms
*Assistant Examiner*—Dung A Le
(74) *Attorney, Agent, or Firm*—Monica H. Choi

(57) ABSTRACT

A gate structure of a field effect transistor is fabricated with a gate dielectric having a dielectric constant that is higher than the dielectric constant of silicon dioxide ($SiO_2$) (i.e., a high dielectric constant material) for higher thickness of the gate dielectric for field effect transistors having scaled down dimensions of tens of nanometers. A blocking layer is deposited on a top surface of a semiconductor substrate, and a vertical opening is etched in the blocking layer. Spacers having a substantially triangular shape are formed on sidewalls of the vertical opening to form a trapezoidal opening having sidewalls of the spacers and a bottom wall of the top surface of the semiconductor substrate. The trapezoidal opening is filled with a dielectric material at a bottom portion of the trapezoidal opening to form a gate dielectric of the field effect transistor. The gate dielectric has a trapezoidal shape with a larger width toward the top from the bottom of the gate dielectric for maximizing charge carrier accumulation in the channel of the MOSFET for enhanced speed performance of the MOSFET. In addition, with higher thickness of the gate dielectric, undesirable charger carrier tunneling through the gate dielectric is minimized. The top portion of the trapezoidal opening is filled with a conductive material to form a gate electrode having a trapezoidal shape with a larger width toward the top from the bottom of the gate electrode with the bottom of the gate electrode contacting the top of the gate dielectric. With a trapezoidal shape for the gate electrode, a higher volume of gate electrode results in lowered gate resistance for enhanced speed performance of the MOSFET.

20 Claims, 4 Drawing Sheets

US 6,326,273 B1

METHOD OF FABRICATING A FIELD EFFECT TRANSISTOR WITH TRAPEZOIDAL SHAPED GATE DIELECTRIC AND/OR GATE ELECTRODE

TECHNICAL FIELD

The present invention relates generally to fabrication of field effect transistors having scaled-down dimensions, and more particularly, to fabrication of a field effect transistor with a gate dielectric and/or a gate electrode with a trapezoidal shape for maximizing charge accumulation under the gate dielectric of the field effect transistor.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Referring to FIG. 1, a common component of a monolithic IC is a MOSFET (Metal Oxide Semiconductor Field Effect Transistor) 100 which is fabricated within a semiconductor substrate 102. The scaled down MOSFET 100 having submicron or nanometer dimensions includes a drain extension 104 and a source extension 106 formed within an active device area 126 of the semiconductor substrate 102. The drain extension 104 and the source extension 106 are shallow junctions to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain silicide 110 and the source silicide 114 respectively may be fabricated therein to provide low resistance contact to the drain and the source respectively of the MOSFET 100.

The MOSFET 100 further includes a gate dielectric 116 and a gate electrode 118 which may be comprised of polysilicon. A gate silicide 120 is formed on the polysilicon gate electrode 118 for providing contact to the gate of the MOSFET 100. The MOSFET 100 is electrically isolated from other integrated circuit devices within the semiconductor substrate 102 by shallow trench isolation structures 121. The shallow trench isolation structures 121 define the active device area 126, within the semiconductor substrate 102, where a MOSFET is fabricated therein.

The MOSFET 100 also includes a spacer 122 disposed on the sidewalls of the gate electrode 118 and the gate dielectric 116. When the spacer 122 is comprised of silicon nitride (SiN), then a spacer liner oxide 124 is deposited as a buffer layer between the spacer 122 and the sidewalls of the gate electrode 118 and the gate dielectric 116.

Conventionally, the gate dielectric 116 for the MOSFET 100 is typically comprised of silicon dioxide ($SiO_2$), and the gate electrode 118 is typically comprised of polysilicon. In addition, in the prior art, the gate dielectric 116 and the gate electrode 118 of the MOSFET 100 typically has a rectangular shape in the cross sectional view of FIG. 1.

As the channel length and width dimensions of the MOSFET 100 are scaled down for enhanced speed performance, the thicknesses of the gate dielectric 116 and the gate electrode 118 are also correspondingly scaled down, as known to one of ordinary skill in the art of integrated circuit fabrication. However, as the channel length and width dimensions of the MOSFET 100 are scaled down to tens of nanometers, the thickness of the gate dielectric 116 is also scaled down to tens of angstroms when the gate dielectric 116 is comprised of silicon dioxide ($SiO_2$). With such a thin gate dielectric 116, charge carriers easily tunnel through the gate dielectric 116, as known to one of ordinary skill in the art of integrated circuit fabrication.

When charge carriers tunnel through the gate dielectric 116, gate leakage current undesirably increases resulting in increased static power dissipation and even circuit malfunction. In addition, with charge carriers tunneling through the gate dielectric 116, decreased charge carrier accumulation in the channel of the MOSFET may result in undesirable increase in resistance through the channel of the MOSFET. Furthermore, with the thin gate dielectric 116, the charge accumulation at the gate electrode 118 causes an undesirable increase in charge carrier scattering at the surface of the channel of the MOSFET 100. Such increase in charge carrier scattering in turn results in higher resistance through the channel of the MOSFET.

In light of these disadvantages of the thin gate dielectric 116 in the prior art, fabrication of a new gate structure having a gate dielectric with higher thickness is desired for a field effect transistor having scaled down dimensions of tens of nanometers.

SUMMARY OF THE INVENTION

Accordingly, in a general aspect of the present invention, a gate structure of a field effect transistor is fabricated with a gate dielectric having a dielectric constant that is higher than the dielectric constant of silicon dioxide ($SiO_2$) (i.e., a high dielectric constant material). A dielectric material having a higher dielectric constant has higher thickness for achieving the same capacitance. Thus, when the gate dielectric is comprised of a high dielectric constant material, the gate dielectric has a higher thickness (hundreds of angstroms) than when the gate dielectric is comprised of silicon dioxide ($SiO_2$) (tens of angstroms), for field effect transistors having scaled down dimensions of tens of nanometers.

In addition, the gate dielectric and/or the gate electrode of the gate structure of an aspect of the present invention is formed to have a trapezoidal shape for maximizing charge carrier accumulation in the channel of the MOSFET for enhanced speed performance of the MOSFET.

In one embodiment of the present invention, a gate structure for a field effect transistor is fabricated on a semiconductor substrate. A blocking layer is deposited on a top surface of the semiconductor substrate, and a vertical opening is etched in the blocking layer. The vertical opening has at least one sidewall of the blocking layer and has a bottom wall of the top surface of the semiconductor substrate. A respective spacer is formed on each of the at least one sidewall of the vertical opening. The respective spacer is substantially triangular in shape such that the respective spacer has a gradually smaller width toward the top of the vertical opening from the bottom of the vertical opening to form a trapezoidal opening having at least one sidewall of the respective spacer and a bottom wall of the top surface of the semiconductor substrate. The trapezoidal opening is filled with a dielectric material that contacts the top surface of the semiconductor substrate at the bottom wall of the trapezoidal opening. The dielectric material at a top portion of the trapezoidal opening is etched with the dielectric material remaining at a bottom portion of the trapezoidal opening to form a gate dielectric of the field effect transistor. The gate dielectric has a trapezoidal shape with a larger width toward the top from the bottom of the gate dielectric, and the bottom of the gate dielectric contacts the top surface of the semiconductor substrate.

The present invention may be used to particular advantage when the gate dielectric is comprised of a dielectric material having a dielectric constant that is higher than the dielectric constant of silicon dioxide ($SiO_2$), such as aluminum oxide ($Al_2O_3$), titanium dioxide ($TiO_2$), or tantalum oxide ($Ta_2O_5$). The gate dielectric has a higher thickness when the gate dielectric is comprised of the high dielectric constant material.

With higher thickness of the gate dielectric, charger carrier tunneling through the gate dielectric is reduced such that static power dissipation through the gate of the MOSFET is reduced. In addition, with minimized charger carrier tunneling through the gate dielectric, charge carrier accumulation in the channel of the MOSFET is not minimized such that resistance through the channel of MOSFET is not increased. Furthermore, with a trapezoidal shape of the gate dielectric, charge accumulation at the bottom of the gate dielectric having the smallest width is maximized for minimized resistance through the channel of the MOSFET.

In another embodiment of the present invention, the top portion of the trapezoidal opening is filled with a conductive material to form a gate electrode of the field effect transistor. The gate electrode has a trapezoidal shape with a larger width toward the top from the bottom of the gate electrode with the bottom of the gate electrode contacting the top of the gate dielectric. The gate structure of the field effect transistor is comprised of the gate dielectric and the gate electrode. With a trapezoidal shape for the gate electrode, a higher volume of gate electrode results in lowered gate resistance for enhanced speed performance of the MOSFET.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 1 0, 11, and 12 refer to elements having similar structure and function.

DETAILED DESCRIPTION

Figure 1:
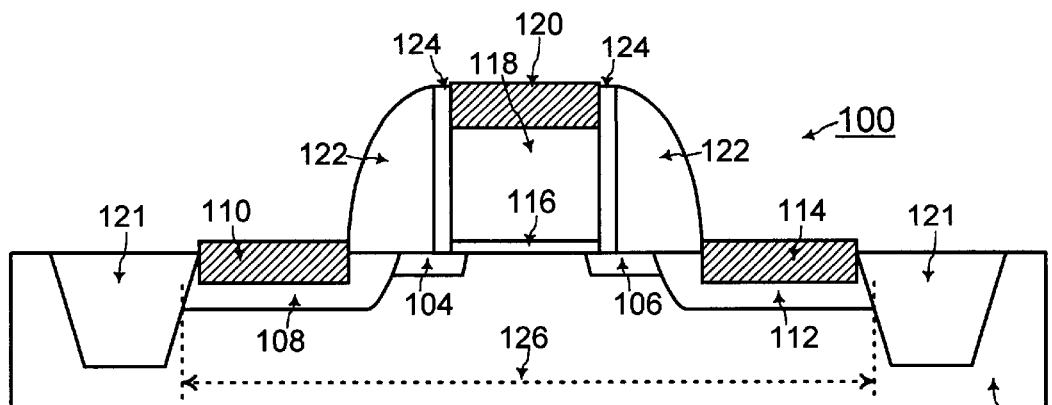
FIG. 1 shows a cross-sectional view of a conventional MOSFET (Metal Oxide Semiconductor Field Effect Transistor) having a gate dielectric and a gate electrode with a rectangular shape and having a thin gate dielectric comprised of silicon dioxide ($SiO_2$)
Figure 2:
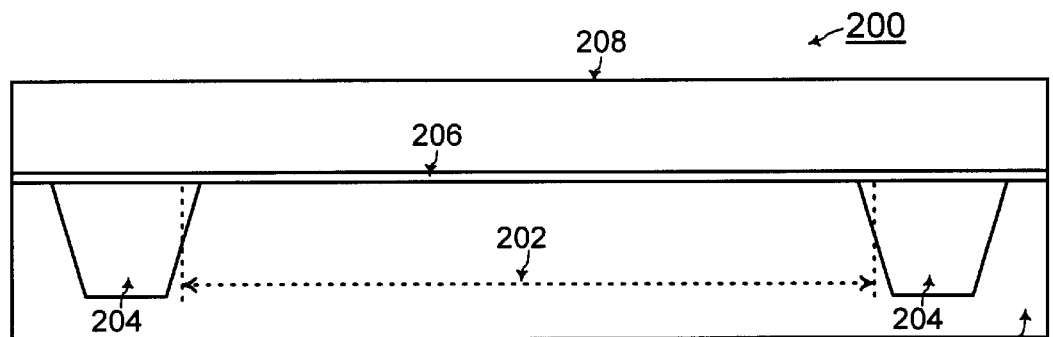
FIGS. 2, 3, 4, 5, 6, 7, 8, 9, 10, 11, and 12 show cross-sectional views of a MOSFET fabricated according to an embodiment of the present invention for illustrating the steps for fabricating a gate structure of the MOSFET with a trapezoidal shape for the gate dielectric and/or the gate electrode of the gate structure and with the gate dielectric comprised of a high dielectric constant material.

Referring to FIG. 2, a MOSFET (Metal Oxide Semiconductor Field Effect Transistor) 200 of an aspect of the present invention is fabricated to have a gate structure with a trapezoidal shape for the gate dielectric and the gate electrode of the gate structure and with the gate dielectric comprised of a high dielectric constant material.

Referring to FIG. 2, such a MOSFET 200 is fabricated within an active device area 202 which may be defined between trench isolation structures 204 in the semiconductor substrate 102. A buffer layer 206 of silicon dioxide ($SiO_2$) is deposited on a top surface of the semiconductor substrate 102 when a blocking layer 208 of silicon nitride ($Si_3N_4$) is deposited on the buffer layer of silicon dioxide ($SiO_2$). The buffer layer 206 of silicon dioxide ($SiO_2$) provides a smoother crystal structure transition from the blocking layer 208 of silicon nitride ($Si_3N_4$) to the top surface of the semiconductor wafer 102 comprised of silicon.

The thickness of the buffer layer 206 of silicon dioxide ($SiO_2$) may be in the range of from about 100 Å (angstroms) to about 200 Å (angstroms). The thickness of the blocking layer 208 of silicon nitride ($Si_3N_4$) may be in the range of from about 1000 Å (angstroms) to about 2000 Å (angstroms). Processes for deposition of such a buffer layer 206 and such a blocking layer 208 are known to one of ordinary skill in the art of integrated circuit fabrication.

Figure 3:
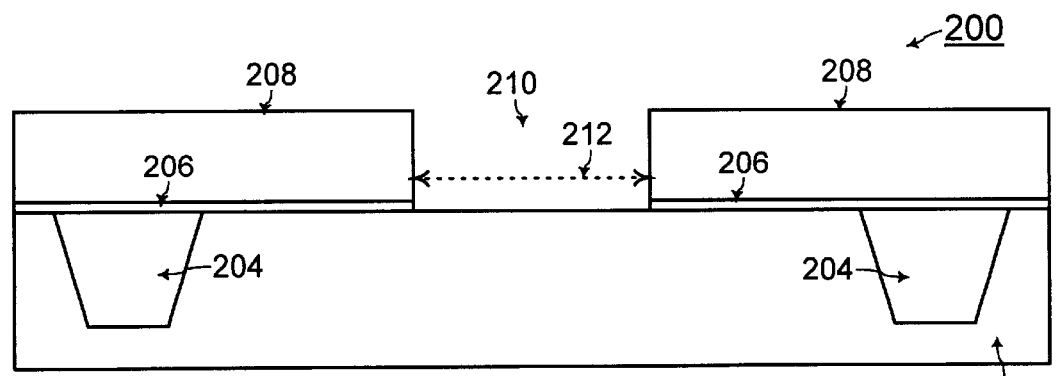

Referring to FIG. 3, a vertical opening 210 is etched through the blocking layer 208 and the buffer layer 206. The width 212 of the vertical opening 210 may be in the range of from about 150 nanometers to about 200 nanometers. Processes for etching such a vertical opening 210 through the buffer layer 206 and the blocking layer 208, such as use of photolithography and a dry etch for example, are known to one of ordinary skill in the art of integrated circuit fabrication. The vertical opening 210 has sidewalls comprised of the blocking layer 208 and the buffer layer 206 and has a bottom wall comprised of the top surface of the semiconductor substrate 102.

Figure 4:
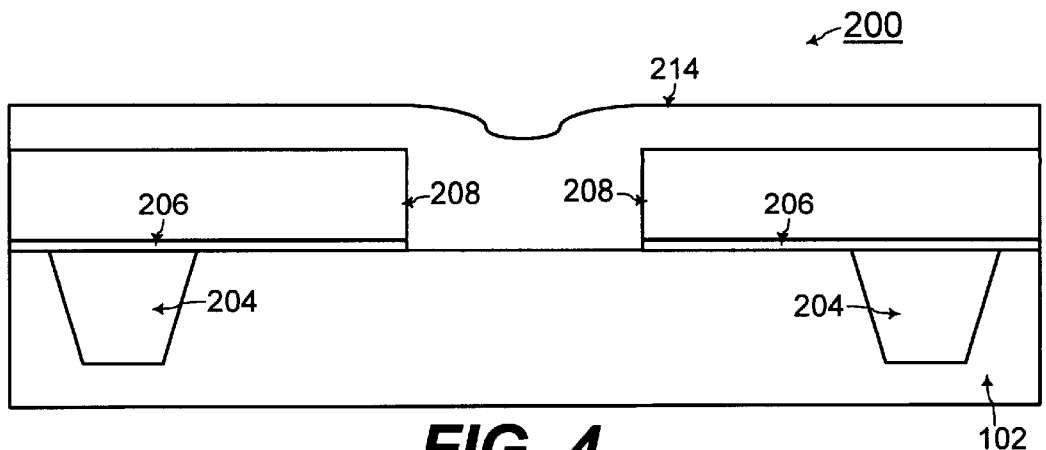

Referring to FIGS. 3 and 4, a spacer dielectric layer 214 comprised of a dielectric material such as silicon dioxide ($SiO_2$) for example is deposited to fill the vertical opening 210. The thickness of the spacer dielectric layer 214 may be in the range of from about 3000 Å (angstroms) to about 4000 Å (angstroms) when the spacer dielectric layer 214 is comprised of silicon dioxide ($SiO_2$). Processes for depositing such a spacer dielectric layer 214 are known to one of ordinary skill in the art of integrated circuit fabrication.

Figure 5:
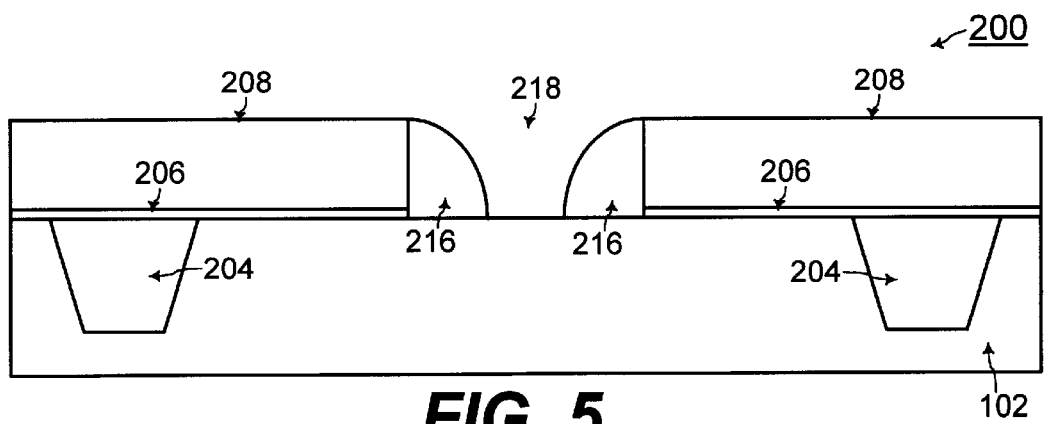

Referring to FIGS. 4 and 5, the spacer dielectric layer 214 is anisotropically etched such that a respective spacer 216 forms on each sidewall of the vertical opening 210. Each of the spacers 216 is triangular in shape with a gradually smaller width toward the top of the vertical opening from the bottom of the vertical opening. The width of each of the spacers 216 at the middle of the height of each of the spacers 216 is about 500 Å (angstroms). Processes for anisotropically etching the spacer dielectric layer 214 to form the spacers 216, such as dry etch processes, are known to one of ordinary skill in the art of integrated circuit fabrication.

Referring to FIG. 5, a trapezoidal opening 218 is formed having sidewalls of the spacers 216 and having a bottom wall of the top surface of the semiconductor substrate 102. The trapezoidal opening 218 has a larger width toward the top of the opening 218 from the bottom of the opening 218.

Figure 6:
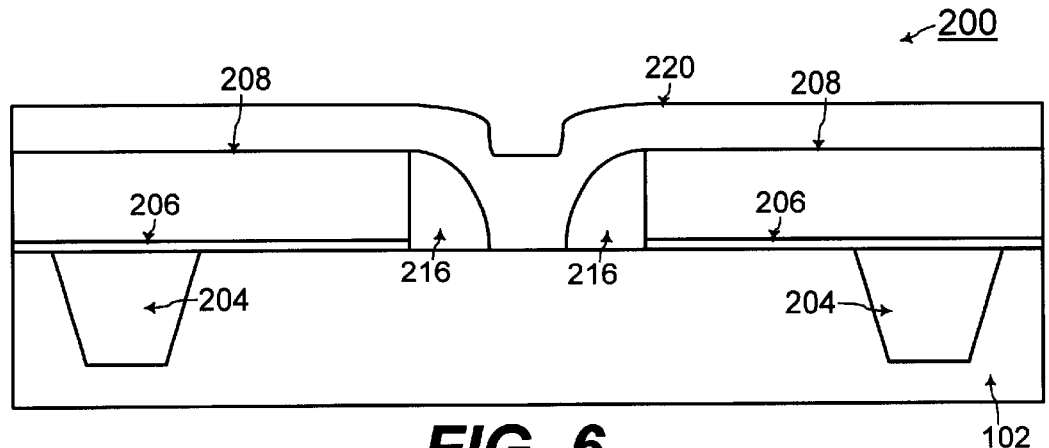

Referring to FIGS. 5 and 6, for forming a gate dielectric of the MOSFET 200, a layer of gate dielectric material 220 is deposited to fill the trapezoidal opening 218. The gate dielectric material 220 contacts the semiconductor substrate 102 at the bottom of the trapezoidal opening 218. The gate dielectric material 220 is a high dielectric constant material (i.e., a dielectric material having a dielectric constant that is higher than the dielectric constant of silicon dioxide ($SiO_2$)) such as aluminum oxide ($Al_2O_3$), titanium dioxide ($TiO_2$), or tantalum oxide ($Ta_2O_5$). Processes for depositing such a layer of gate dielectric material 220 having high dielectric constant are known to one of ordinary skill in the art of integrated circuit fabrication.

Figure 7:
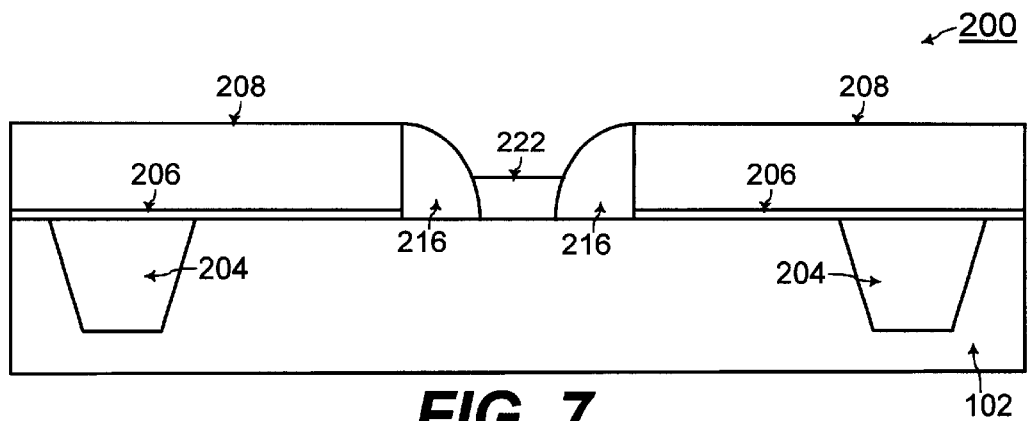

Referring to FIGS. 6 and 7, the gate dielectric material 220 is etched from the top portion of the trapezoidal opening 218 such that the gate dielectric material 220 remains at the bottom portion of the trapezoidal opening 218 to form a gate dielectric 222 of the MOSFET 200. A first etching process may be used to etch away a substantial portion of the gate dielectric material 220 from the blocking layer 208. A well-controlled second etching process may then be used such that the thickness of the gate dielectric 222 remaining at the bottom of the trapezoidal opening may be controlled to be in a range of from about 300 Å (angstroms) to about 500 Å (angstroms). Processes for etching the layer of gate dielectric material 220 having high dielectric constant to form such a gate dielectric 222 are known to one of ordinary skill in the art of integrated circuit fabrication.

Referring to FIG. 7, the gate dielectric 222 formed within the trapezoidal opening 218 has a trapezoidal shape with a larger width toward the top from the bottom of the gate dielectric 222. The bottom of the gate dielectric 222 contacts the top surface of the semiconductor substrate 102. The thickness of the gate dielectric 222 depends on the dielectric constant of the gate dielectric material 220. However, because the gate dielectric 222 is comprised of a dielectric material having a dielectric constant that is higher than the dielectric constant of silicon dioxide ($SiO_2$), the thickness of the gate dielectric 222 is higher (i.e. hundreds of angstroms) than the thickness of a gate dielectric comprised of silicon dioxide ($SiO_2$), when the MOSFET 200 has scaled down dimensions of tens of nanometers.

Figure 8:
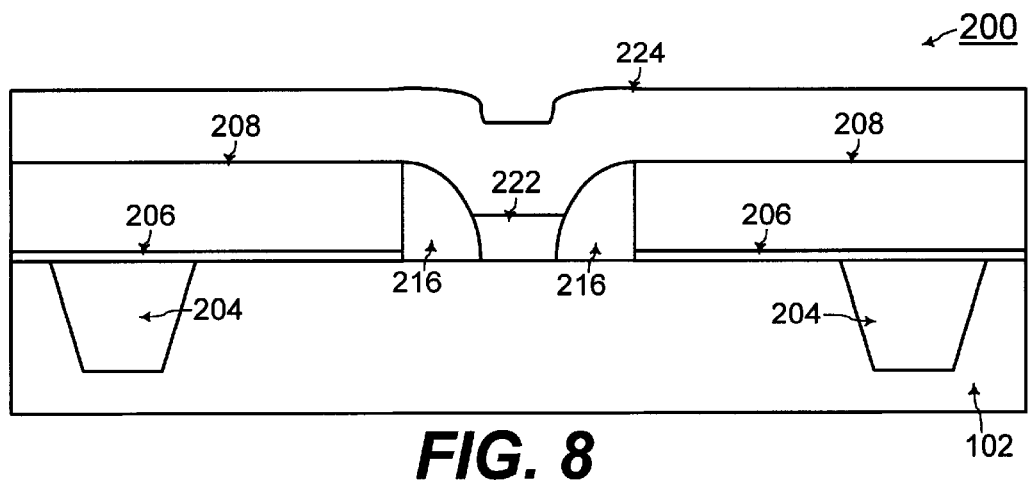

Referring to FIGS. 7 and 8, for forming the gate electrode of the MOSFET 200, a layer of conductive material 224 is deposited to fill the top portion of the trapezoidal opening 218 and on the blocking layer 208. The layer of conductive material 224 may be comprised of one of titanium, tungsten, copper, aluminum, platinum, polysilicon, or polysilicon germanium, and may have a thickness in a range of from about 2000 Å (angstroms) to about 2500 Å (angstroms). Processes for depositing such a layer of conductive material 224 are known to one of ordinary skill in the art of integrated circuit fabrication.

Figure 9:
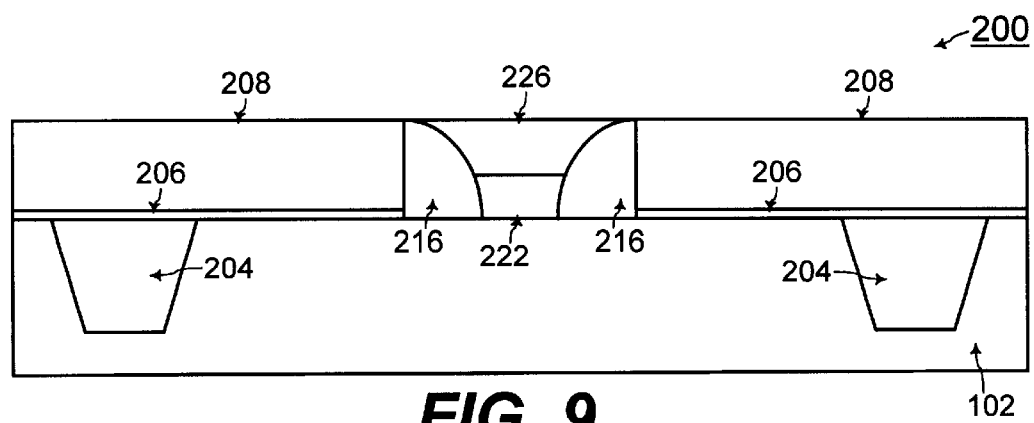

Referring to FIGS. 8 and 9, the conductive material 224 is polished down and away from the blocking layer 208 such that the conductive material 224 is contained within the top portion of the trapezoidal opening 218 to form a gate electrode 226. Processes for polishing the layer of conductive material 224 such as CMP (chemical mechanical polishing) processes are known to one of ordinary skill in the art of integrated circuit fabrication.

The gate electrode 226 contained within the trapezoidal opening 218 has a trapezoidal shape with a larger width toward the top from the bottom of the gate electrode 226. The bottom of the gate electrode 226 contacts the top of the gate dielectric 222. The gate structure of the MOSFET 200 is comprised of the gate electrode 226 and the gate dielectric 222 that have the trapezoidal shape.

Figure 10:
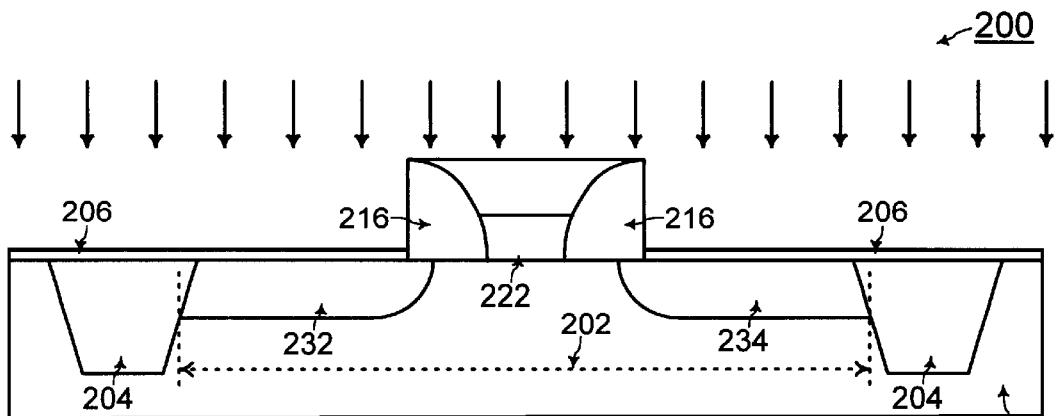

Referring to FIGS. 9 and 10, the blocking layer 208 of silicon nitride ($Si_3N_4$) is etched away such that the spacers 216 are exposed. Processes for etching away the blocking layer 208 of silicon nitride ($Si_3N_4$) are known to one of ordinary skill in the art of integrated circuit fabrication.

Referring to FIG. 10, a contact junction dopant is implanted into exposed regions of the active device area 202 of the semiconductor substrate 102 under the buffer layer 102 using a relatively high energy implantation process for deep implantation of the contact junction dopant (as illustrated by the vertical arrows in FIG. 10) to form a drain contact junction 232 and a source contact junction 234. The relatively thin blocking layer 206 on the semiconductor substrate 102 protects the top surface of the semiconductor substrate 102 from structural damage in the high energy implantation process. When the gate electrode 226 is comprised of polysilicon or polysilicon germanium, the contact junction dopant is also implanted into the gate electrode 226 to enhance the conductivity of the gate electrode 226. A relatively high temperature RTA (rapid thermal anneal) at temperatures in the range of from about 1025° Celsius to about 1050° Celsius activates the contact junction dopant in the drain contact junction 232 and the source contact junction 234 and/or the gate electrode 226.

A relatively high energy implantation process and a relatively high temperature anneal process are used for forming the drain contact junction 232 and the source contact junction 234 such that the drain contact junction 232 and the source contact junction 234 are relatively deep. Deep drain and source contact junctions are desired such that a relatively large size of drain and source silicides may be fabricated therein to provide low resistance contact to the drain and the source of the MOSFET 200. High energy implantation processes and high temperature anneal processes are known to one of ordinary skill in the art of integrated circuit fabrication.

Figure 11:
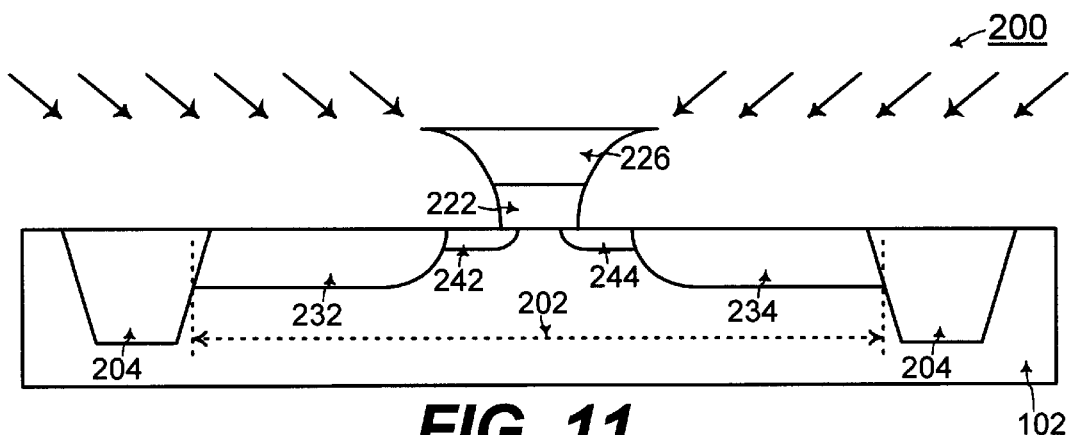

Referring to FIGS. 10 and 11, the spacers 216 on the sidewalls of the gate electrode 226 and the gate dielectric 222 and the buffer layer 210 of silicon dioxide ($SiO_2$) are etched away typically by a wet chemical etch process such that the sidewalls of the gate electrode 226 and the gate dielectric 222 are exposed. Processes for etching away the spacers 216 and the buffer layer of silicon dioxide ($SiO_2$) are known to one of ordinary skill in the art of integrated circuit fabrication.

Referring to FIG. 11, an extension junction dopant is implanted into exposed regions of the active device area 202 of the semiconductor substrate 102 using angle-tilted implantation toward the sidewalls of the gate electrode 226 and the gate dielectric 222 (as illustrated by the angled arrows in FIG. 10) to form a drain extension junction 242 and a source extension junction 244. A relatively low temperature RTA (rapid thermal anneal) at temperatures in the range of from about 900° Celsius to about 950° Celsius activates the extension junction dopant in the drain extension junction 242 and the source extension junction 244.

A relatively low temperature anneal process is used for forming the drain extension junction 242 and the source extension junction 244 such that the drain extension junction 242 and the source extension junction 244 are relatively shallow. Shallow drain and source extension junctions are desired for minimizing undesirable short-channel effects in the MOSFET 200 having scaled down dimensions, as known to one of ordinary skill in the art of integrated circuit fabrication. Angle-tilted implantation processes and low temperature anneal processes are known to one of ordinary skill in the art of integrated circuit fabrication.

Figure 12:
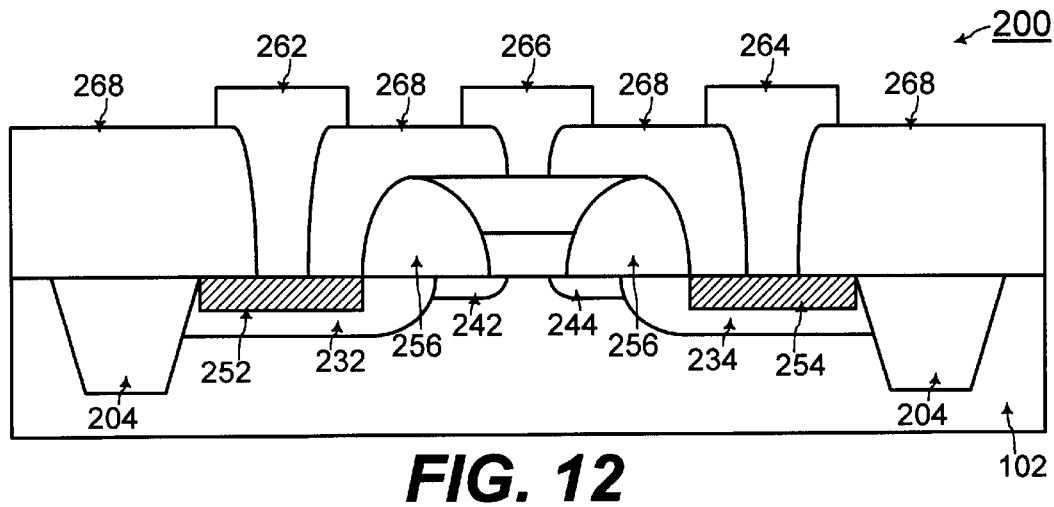

Referring to FIG. 12, a drain silicide 252 is formed with the drain contact junction 232 for providing contact to the drain of the MOSFET 200, and a source silicide 254 is formed with the source contact junction 234 for providing contact to the source of the MOSFET 200. Such silicides may be comprised of one of cobalt silicide ($CoSi_2$) or titanium silicide ($TiSi_2$) for example, and processes for formation of such suicides are known to one of ordinary skill in the art of integrated circuit fabrication. In addition, an isolation spacer 256 such as a conventional oxide spacer may be formed on the sidewalls of the gate electrode 226 and the gate dielectric 222.

Further referring to FIG. 12, conventional fabrication processes may follow for forming contacts and interconnects to the MOSFET 200 such as a drain contact 262 to provide connection to the drain silicide 252, a source contact 264 to provide connection to the source silicide 254, and a gate contact 266 to provide connection to the gate electrode 226. Field oxides 268 may also be deposited for electrical isolation of the components of the MOSFET 200.

In this manner, with higher thickness of the gate dielectric 222, charger carrier tunneling through the gate dielectric 222 is reduced such that static power dissipation through the gate of the MOSFET 200 is reduced. In addition, with minimized charger carrier tunneling through the gate dielectric 222, charge carrier accumulation in the channel of the MOSFET 200 is not minimized such that resistance through the channel of MOSFET 200 is not increased. Furthermore, with a trapezoidal shape of the gate dielectric 222, charge accumulation at the bottom of the gate dielectric 222 having the smallest width is maximized for minimized resistance through the channel of the MOSFET 200. Minimized resistance through the channel of the MOSFET 200 enhances the speed performance of the MOSFET 200. Also, with a trapezoidal shape for the gate electrode, a higher volume of gate electrode results in lowered gate resistance for enhanced speed performance of the MOSFET.

The foregoing is by way of example only and is not intended to be limiting. For example, any specified material or any specified dimension of any structure described herein is by way of example only. In addition, as will be understood by those skilled in the art, the structures described herein may be made or used in the same way regardless of their position and orientation. Accordingly, it is to be understood that terms and phrases such as "top," "sidewall," "on," and "under" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

I claim:

1. A method for fabricating a gate structure for a field effect transistor on a semiconductor substrate, the method including the steps of:

A. depositing a blocking layer on a top surface of said semiconductor substrate;

B. etching a vertical opening in said blocking layer, said vertical opening having at least one sidewall of said blocking layer and having a bottom wall of said top surface of said semiconductor substrate;

C. forming a respective spacer on each of said at least one sidewall of said vertical opening, wherein said respective spacer is substantially triangular in shape such that said respective spacer has a gradually smaller width toward the top of said vertical opening from the bottom of said vertical opening to form a trapezoidal opening having at least one sidewall of said respective spacer and a bottom wall of said top surface of said semiconductor substrate;

D. filling said trapezoidal opening with a dielectric material that contacts said top surface of said semiconductor substrate at said bottom wall of said trapezoidal opening; and E. etching said dielectric material at a top portion of said trapezoidal opening with said dielectric material remaining at a bottom portion of said trapezoidal opening to form a gate dielectric of said field effect transistor, said gate dielectric having a trapezoidal shape with a larger width toward the top from the bottom of said gate dielectric, said bottom of said gate dielectric contacting said top surface of said semiconductor substrate;

wherein said dielectric material remains to cover said semiconductor substrate at said bottom portion of said trapezoidal opening after said step E.

2. The method of claim 1, further including the steps of:

F. filling said top portion of said trapezoidal opening with a conductive material to form a gate electrode of said field effect transistor, said gate electrode having a trapezoidal shape with a larger width toward the top from the bottom of said gate electrode, said bottom of said gate electrode contacting the top of said gate dielectric, wherein said gate structure of said field effect transistor is comprised of said gate dielectric and said gate electrode.

3. The method of claim 2, wherein said step F further includes the steps of:

depositing said conductive material within said top portion of said trapezoidal opening and on said blocking layer; and polishing down said conductive material away from said blocking layer such that said conductive material is contained within said top portion of said trapezoidal opening.

4. The method of claim 2, wherein said conductive material forming said gate electrode is comprised of one of titanium, tungsten, copper, aluminum, platinum, polysilicon, or polysilicon germanium.

5. The method of claim 2, further including the steps of:

etching away said blocking layer until said respective spacer on at least one sidewall of said gate structure remains; and implanting a contact junction dopant into exposed regions of said semiconductor substrate to form a drain contact junction and a source contact junction of said field effect transistor.

6. The method of claim 5, further including the steps of:

etching away said respective spacer on said at least one sidewall of said gate structure; and implanting an extension junction dopant into exposed regions of said semiconductor substrate at an angle toward said at least one sidewall of said gate structure to form a drain extension junction and a source extension junction of said field effect transistor.

7. The method of claim 1, wherein said respective spacer at said at least one sidewall of said vertical opening is comprised of silicon dioxide ($SiO_2$).

8. The method of claim 1, wherein said dielectric material of said gate dielectric has a dielectric constant that is higher than the dielectric constant of silicon dioxide ($SiO_2$).

9. The method of claim 8, wherein said dielectric material of said gate dielectric is comprised of one of aluminum oxide ($Al_2O_3$), titanium dioxide ($TiO_2$), or tantalum oxide ($Ta_2O_5$).

10. The method of claim 1, wherein said predetermined thickness of said gate dielectric is in a range of from about 300 Å (angstroms) to about 500 Å (angstroms).

11. A method for fabricating a gate structure for a field effect transistor on a semiconductor substrate, the method including the steps of:
   A. depositing a blocking layer on a top surface of said semiconductor substrate;
   B. etching a vertical opening in said blocking layer, said vertical opening having at least one sidewall of said blocking layer and having a bottom wall of said top surface of said semiconductor substrate;
   C. forming a respective spacer on each of said at least one sidewall of said vertical opening,
      wherein said respective spacer is substantially triangular in shape such that said respective spacer has a gradually smaller width toward the top of said vertical opening from the bottom of said vertical opening to form a trapezoidal opening having at least one sidewall of said respective spacer and a bottom wall of said top surface of said semiconductor substrate;
   D. filling said trapezoidal opening with a dielectric material that contacts said top surface of said semiconductor substrate at said bottom wall of said trapezoidal opening;
   E. etching said dielectric material at a top portion of said trapezoidal opening with said dielectric material remaining at a bottom portion of said trapezoidal opening to form a gate dielectric of said field effect transistor, said gate dielectric having a trapezoidal shape with a larger width toward the top from the bottom of said gate dielectric, said bottom of said gate dielectric contacting said top surface of said semiconductor substrate;
      wherein said blocking layer is comprised of silicon nitride ($Si_3N_4$); and
   F. depositing a buffer layer of silicon dioxide ($SiO_2$) on said top surface of said semiconductor substrate before said step A of depositing said blocking layer of silicon nitride ($Si_3N_4$) on said buffer layer of silicon dioxide ($SiO_2$).

12. The method of claim 11, further including the step of:
   filling said top portion of said trapezoidal opening with a conductive material to form a gate electrode of said field effect transistor, said gate electrode having a trapezoidal shape with a larger width toward the top from the bottom of said gate electrode, said bottom of said gate electrode contacting the top of said gate dielectric,
      wherein said gate structure of said field effect transistor is comprised of said gate dielectric and said gate electrode.

13. The method of claim 12, wherein said step of filling said top portion of said trapezoidal opening further includes the steps of:
   depositing said conductive material within said top portion of said trapezoidal opening and on said blocking layer; and
   polishing down said conductive material away from said blocking layer such that said conductive material is contained within said top portion of said trapezoidal opening.

14. The method of claim 12, wherein said conductive material forming said gate electrode is comprised of one of titanium, tungsten, copper, aluminum, platinum, polysilicon, or polysilicon germanium.

15. The method of claim 12, further including the steps of:
   etching away said blocking layer until said respective spacer on at least one sidewall of said gate structure remains; and
   implanting a contact junction dopant into exposed regions of said semiconductor substrate to form a drain contact junction and a source contact junction of said field effect transistor.

16. The method of claim 15, further including the steps of:
   etching away said respective spacer on said at least one sidewall of said gate structure; and
   implanting an extension junction dopant into exposed regions of said semiconductor substrate at an angle toward said at least one sidewall of said gate structure to form a drain extension junction and a source extension junction of said field effect transistor.

17. The method of claim 11, wherein said respective spacer at said at least one sidewall of said vertical opening is comprised of silicon dioxide ($SiO_2$).

18. The method of claim 11, wherein said dielectric material of said gate dielectric has a dielectric constant that is higher than the dielectric constant of silicon dioxide ($SiO_2$).

19. The method of claim 18, wherein said dielectric material of said gate dielectric is comprised of one of aluminum oxide ($Al_2O_3$), titanium dioxide ($TiO_2$), or tantalum oxide ($Ta_2O_5$).

20. A method for fabricating a gate structure for a field effect transistor on a semiconductor substrate, the method including the steps of:
   A. depositing a buffer layer of silicon dioxide ($SiO_2$) on a top surface of said semiconductor substrate;
   B. depositing a blocking layer of silicon nitride ($Si_3N_4$) on said buffer layer of silicon dioxide ($SiO_2$);
   C. etching a vertical opening though said blocking layer and said buffer layer, said vertical opening having at least one sidewall of said blocking layer and said buffer layer and having a bottom wall of said top surface of said semiconductor substrate;
   D. forming a respective spacer on each of said at least one sidewall of said vertical opening, wherein said respective spacer is comprised of silicon dioxide ($SiO_2$),
      and wherein said respective spacer is substantially triangular in shape such that said respective spacer has a gradually smaller width toward the top of said vertical opening from the bottom of said vertical opening to form a trapezoidal opening having at least one sidewall of said respective spacer and a bottom wall of said top surface of said semiconductor substrate;
   E. filling said trapezoidal opening with a dielectric material that contacts said top surface of said semiconductor substrate at said bottom wall of said trapezoidal opening, wherein said dielectric material has a dielectric constant that is higher than the dielectric constant of silicon dioxide ($SiO_2$), and wherein said dielectric material is comprised of one of aluminum oxide ($Al_2O_3$), titanium dioxide ($TiO_2$), or tantalum oxide ($Ta_2O_5$);
   F. etching said dielectric material at a top portion of said trapezoidal opening with said dielectric material remaining at a bottom portion of said trapezoidal opening to form a gate dielectric of said field effect transistor, said gate dielectric having a trapezoidal shape with a larger width toward the top from the bottom of said gate dielectric, said bottom of said gate dielectric contacting said top surface of said semiconductor substrate, and said gate dielectric having a predetermined thickness in a range of from about 300 Å (angstroms) to about 500 Å (angstroms);

G. filling said top portion of said trapezoidal opening with a conductive material to form a gate electrode of said field effect transistor, said gate electrode having a trapezoidal shape with a larger width toward the top from the bottom of said gate electrode, said bottom of said gate electrode contacting the top of said gate dielectric, wherein said gate structure of said field effect transistor is comprised of said gate electrode and said gate dielectric, and wherein said conductive material forming said gate electrode is comprised of one of titanium, tungsten, copper, aluminum, platinum, polysilicon, or polysilicon germanium;

wherein said step G further includes the steps of:
depositing said conductive material within said top portion of said trapezoidal opening and on said blocking layer; and polishing down said conductive material away from said blocking layer such that said conductive material is contained within said top portion of said trapezoidal opening;

H. etching away said blocking layer until said respective spacer on at least one sidewall of said gate structure remains;

I. implanting a contact junction dopant into exposed regions of said semiconductor substrate to form a drain contact junction and a source contact junction of said field effect transistor;

J. etching away said buffer layer and said respective spacer on said at least one sidewall of said gate structure; and K. implanting an extension junction dopant into exposed regions of said semiconductor substrate at an angle toward said at least one sidewall of said gate structure to form a drain extension junction and a source extension junction of said field effect transistor.

\* \* \* \* \*